(12) United States Patent
Chen (10) Patent No.: US 11,255,881 B2
(45) Date of Patent: Feb. 22, 2022

(54) INDUCTOR CURRENT DETECTING CIRCUIT

(71) Applicant: ANPEC ELECTRONICS CORPORATION, Hsinchu (TW)

(72) Inventor: Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 41 days.

(21) Appl. No.: 17/011,004

(22) Filed: Sep. 3, 2020

(65) Prior Publication Data

US 2021/0364554 A1 Nov. 25, 2021

(30) Foreign Application Priority Data

May 22, 2020 (TW) .................................. 109117004

(51) Int. Cl.
*G01R 15/06* (2006.01)
*G01R 15/18* (2006.01)

(52) U.S. Cl.
CPC ............. *G01R 15/06* (2013.01); *G01R 15/18* (2013.01)

(58) Field of Classification Search
CPC ........ G01R 15/06; G01R 15/12; G01R 15/18; G01R 15/186; G01R 19/00; G01R 19/0069; G01R 19/0092; G01R 19/08; G01R 19/15; G01R 19/165; H02M 1/4291; H02M 3/1582; H02M 3/1552; H02M 3/01

See application file for complete search history.

(56) References Cited

U.S. PATENT DOCUMENTS

| | | | |
|---|---|---|---|
| 8,207,721 B2* | 6/2012 | Sohma ................. | H02M 3/156 323/282 |
| 10,063,146 B1* | 8/2018 | Lee ....................... | G01R 19/003 |
| 2008/0088292 A1* | 4/2008 | Stoichita .............. | H02M 3/156 323/285 |
| 2013/0293211 A1* | 11/2013 | Chen ................... | H02M 3/1588 323/282 |
| 2015/0214827 A1* | 7/2015 | Yoon ..................... | H02M 1/14 323/286 |
| 2015/0326123 A1* | 11/2015 | Fukushima .......... | H02M 3/158 323/271 |

FOREIGN PATENT DOCUMENTS

TW  201417464 A  5/2014
TW  201838304 A  10/2018

* cited by examiner

*Primary Examiner* — Son T Le
(74) *Attorney, Agent, or Firm* — Li & Cai Intellectual Property (USA) Office (57) ABSTRACT

An inductor current detecting circuit is provided. A differentiator circuit differentiates a high-side voltage signal to generate a first differential signal, and differentiates a low-side voltage signal to generate a second differential signal. A first current source outputs a first charging current according to the first differential signal. A second current source outputs a second charging current according to the second differential signal. First and second terminals of a first switch are respectively connected to the first current source and a first terminal of a second switch. A second terminal of the second switch is connected to the second current source. Two terminals of a capacitor are connected to the second terminal of the first switch and the second current source respectively. The first switch and the second switch are alternately turned on to obtain a continuous waveform.

7 Claims, 5 Drawing Sheets

INDUCTOR CURRENT DETECTING CIRCUIT

CROSS-REFERENCE TO RELATED PATENT APPLICATION

This application claims the benefit of priority to Taiwan Patent Application No. 109117004, filed on May 22, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an inductor current detecting current, and more particularly to an inductor current detecting current for a power converter.

BACKGROUND OF THE DISCLOSURE

A power converter is essential for voltage adjustment and stabilization of an electronic device. Based upon different power requirements, various types of DC-DC voltage converters such as a buck converter and a boost converter have been developed. The buck converter can decrease an input DC voltage to a default voltage, and the boost converter can increase an input DC voltage. With advances in circuit technologies, both the buck and boost converters have been adjusted for different system architectures and requirements.

If a conventional power converter operates in a current controlling mode, a current value of an inductor of the conventional power converter needs to be detected. A high-side switch and a low-side switch of the conventional power converter are turned on or off according to the detected current value. In order to obtain the current value of the inductor, a resistor is additionally disposed in the conventional power converter and connected in series with the inductor. The current value of the inductor is equal to a current value of the resistor. Therefore, the conventional power converter obtains the current value of the inductor by detecting the current value of the resistor. However, the resistor not only occupies a space inside the conventional power converter, but also increases additional power consumption. In recent years, in order to meet low power consumption requirements, the resistor must have a small resistance. Under this condition, when the current value of the resistor cannot be accurately detected, the high-side switch and the low-side switch cannot be accurately turned on or off. Therefore, the conventional power converter cannot achieve a fast response effect.

SUMMARY OF THE DISCLOSURE

In response to the above-referenced technical inadequacies, the present disclosure provides an inductor current detecting circuit for a power converter. The power converter includes an output inductor, an output capacitor, a high-side switch, a low-side switch, a comparator, a control circuit and a voltage divider circuit. One terminal of the output inductor is connected to a node between the high-side switch and the low-side switch. Another terminal of the output inductor is grounded through the output capacitor. The voltage divider circuit is connected to an output node between the output inductor and the output capacitor and divides an output voltage of the output node to output a feedback voltage. The comparator compares the feedback voltage with a reference voltage to output a comparison signal. The control circuit turns on or off the high-side switch and the low-side switch according to the comparison signal. The inductor current detecting circuit includes a detector circuit, a differentiator circuit, a current supplying circuit, a switch circuit and a capacitor. The detector circuit is connected to the high-side switch and the low-side switch. The detector circuit is configured to detect the high-side switch to output a high-side voltage signal and detect the low-side switch to output a low-side voltage signal. The differentiator circuit is connected to the detector circuit, and configured to differentiate the high-side voltage signal to generate a first differential signal and differentiate the low-side voltage signal to generate a second differential signal. The current supplying circuit includes a first current supplying component and a second current supplying component. The current supplying circuit is configured to output a first charging current according to the first differential signal and output a second charging current according to the second differential signal. The switch circuit includes a first switch component and a second switch component. A first terminal of the first switch component is connected to a first terminal of the first current supplying component. A second terminal of the first switch component is connected to a first terminal of the second switch component. A second terminal of the second switch component is connected to the second current supplying component. A first terminal of the capacitor is connected to a node between the first switch component and the second switch component. A second terminal of the capacitor is connected to the second current supplying component and grounded. The first switch component and the second switch component are alternately turned on, the first charging current and the second charging current alternately flow to the capacitor respectively through the first switch component and the second switch component.

In certain embodiments, the inductor current detecting circuit further includes a sample and hold circuit. The sample and hold circuit is connected to the differentiator circuit and the current supplying circuit. The sample and hold circuit is configured to sample and hold parameters of the first differential signal and the second differential signal. The sample and hold circuit is configured to output the parameter of the first differential signal to the first current supplying component and output the parameter of the second differential signal to the second current supplying component.

In certain embodiments, the detector circuit includes a high-side detector circuit and a low-side detector circuit. The high-side detector circuit is connected to the high-side switch and configured to detect the high-side switch to output the high-side voltage signal. The low-side detector circuit is connected to the low-side switch and configured to detect the low-side switch to output the low-side voltage signal.

In certain embodiments, the differentiator circuit includes a first differentiator circuit and a second differentiator circuit. The first differentiator circuit is connected to the high-side detector circuit and configured to differentiate the high-side voltage signal to generate the first differential signal. The second differentiator circuit is connected to the low-side detector circuit and configured to differentiate the low-side voltage signal to generate the second differential signal.

In certain embodiments, the inductor current detecting circuit further includes a first sample and hold circuit and a first sample and hold circuit. The first sample and hold circuit is connected to the first differentiator circuit and the first current supplying component. The first sample and hold circuit is configured to sample and hold a parameter of the first differential signal to be outputted to the first current supplying component. The second sample and hold circuit is connected to the second differentiator circuit and the second current supplying component. The second sample and hold circuit is configured to sample and hold a parameter of the second differential signal to be outputted to the second current supplying component.

In certain embodiments, the inductor current detecting circuit further includes a first current modulation controller circuit and a second current modulation controller circuit. The first current modulation controller circuit is connected to the first sample and hold circuit and the first current supplying component. The first current modulation controller circuit is configured to output a first modulation signal for controlling the first current supplying component according to the parameter of the first differential signal. The second current modulation controller circuit is connected to the second sample and hold circuit and the second current supplying component. The second current modulation controller circuit is configured to output a second modulation signal for controlling the second current supplying component according to the parameter of the second differential signal.

In certain embodiments, the first current supplying component and the second current supplying component are current sources.

As described above, the present disclosure provides the inductor current detecting circuit for the power converter, in which an additional component such as a resistor that causes unnecessary power consumption is not disposed. The inductor current detecting circuit of the present disclosure can detect the complete waveform of the inductor current signal of the power converter. When the power converter such as a buck converter is operated in a current controlling mode, the high-side switch and the low-side switch are controlled according to the complete waveform of the detected inductor current signal. Therefore, the power converter can achieve the fast response effect.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
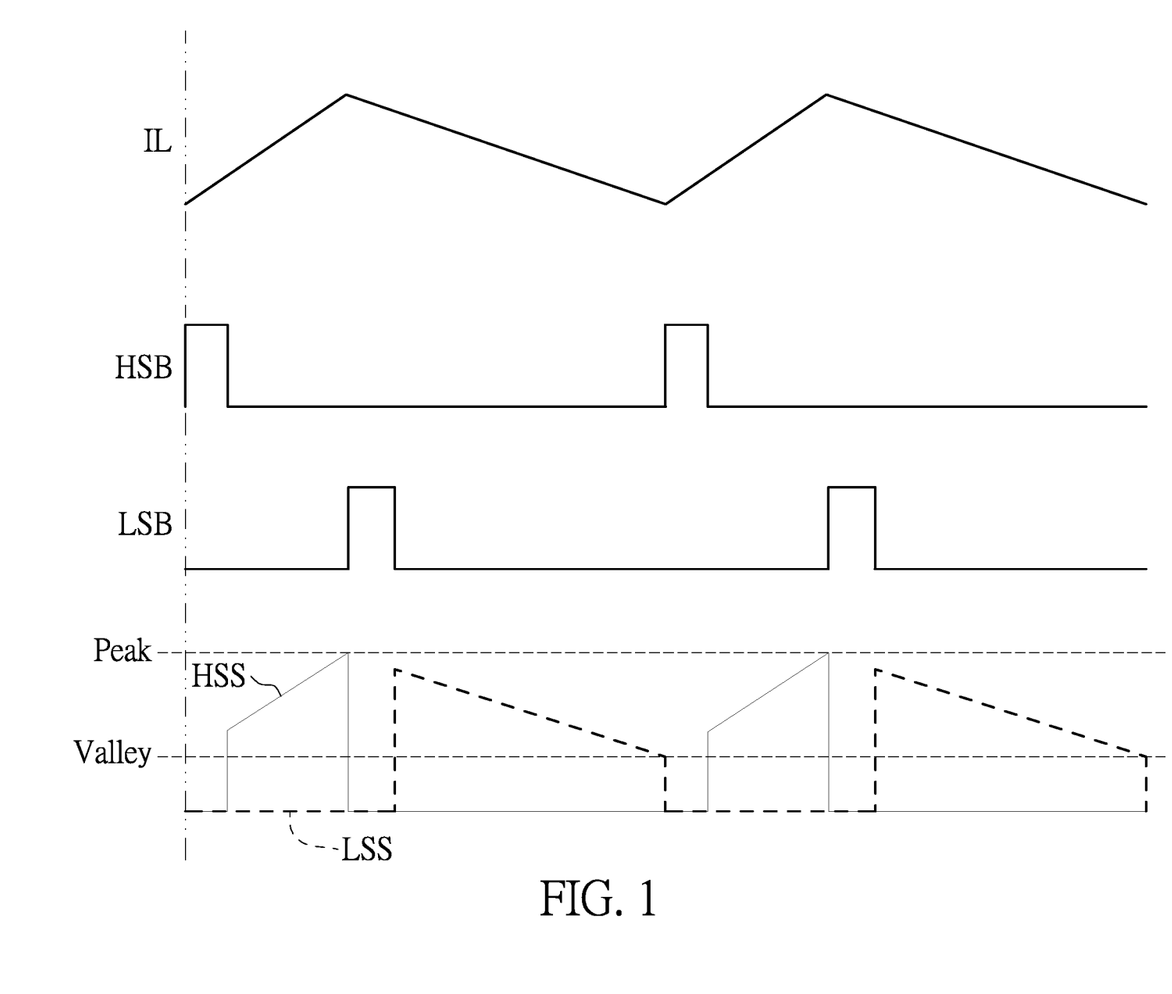
FIG. 1 is a waveform diagram of signals of a power converter.

Reference is made to FIG. 1, which is a waveform diagram of signals of a power converter.

It should be understood by those skilled in the art that, the power converter includes an output inductor, an output capacitor, a high-side switch, a low-side switch, a comparator, a control circuit, and a voltage divider circuit. One terminal of the output inductor of the power converter is connected to a node between the high-side switch and the low-side switch. Another terminal of the output inductor is grounded through the output capacitor. The voltage divider circuit is connected to an output node (that is an output terminal of the power converter) between the output inductor and the output capacitor. The voltage divider circuit divides an output voltage of the output node to output a feedback voltage. The comparator compares the feedback voltage with a reference voltage to output a comparison signal. The control circuit turns on or off the high-side switch and the low-side switch according to the comparison signal.

For convenience of explanation, only basic circuit architecture of the power converter is mentioned herein, but in practice, other circuit components may be additionally disposed in the power converter, and configurations of the circuit components may be determined according to actual requirements.

A purpose of the present disclosure is to accurately obtain a current of an inductor of the power converter such as an inductor current signal IL shown in FIG. 1, and accordingly control the high-side switch and the low-side switch of the power converter such that the power converter achieves a fast response effect.

In order to obtain the inductor current signal IL, when the high-side switch and the low-side switch such as metal oxide semiconductor field effect transistors (MOSFETs) are turned on, a resistance (Rds-on) between a drain and a source of the high-side switch and a resistance between a drain and a source of the low-side switch need to be detected. However, when the metal oxide semiconductor field effect transistors are turned on such that noise is generated, the resistances cannot be detected. For example, the resistances (Rds-on) of the high-side switch and the low-side switch cannot be detected, during a working period of a blank signal HSB of the high-side switch and a working period of a blank signal LSB of the low-side switch as shown in FIG. 1.

As a result, a voltage signal HSS and a voltage signal LSS are discontinuous signals such that the inductor current signal IL obtained by a system has incomplete waveforms. In order to obtain the inductor current signal IL that has continuous and complete waveforms, the present disclosure provides an inductor current detecting circuit as shown in FIGS. 2, 3 and 46, which are specifically described in the following.

Figure 2:
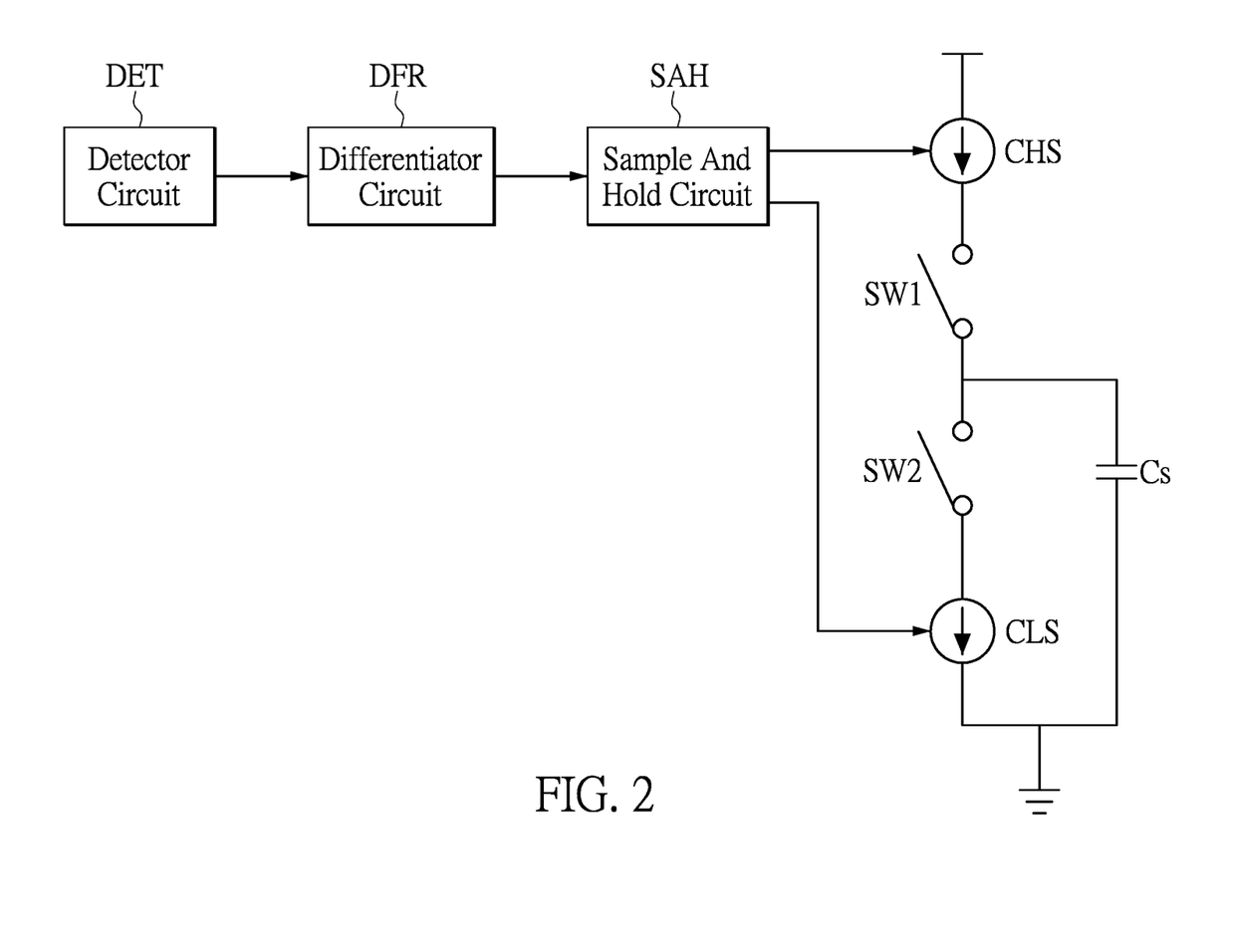
FIG. 2 is a circuit layout diagram of an inductor current detecting circuit according to a first embodiment of the present disclosure.
Figure 3:
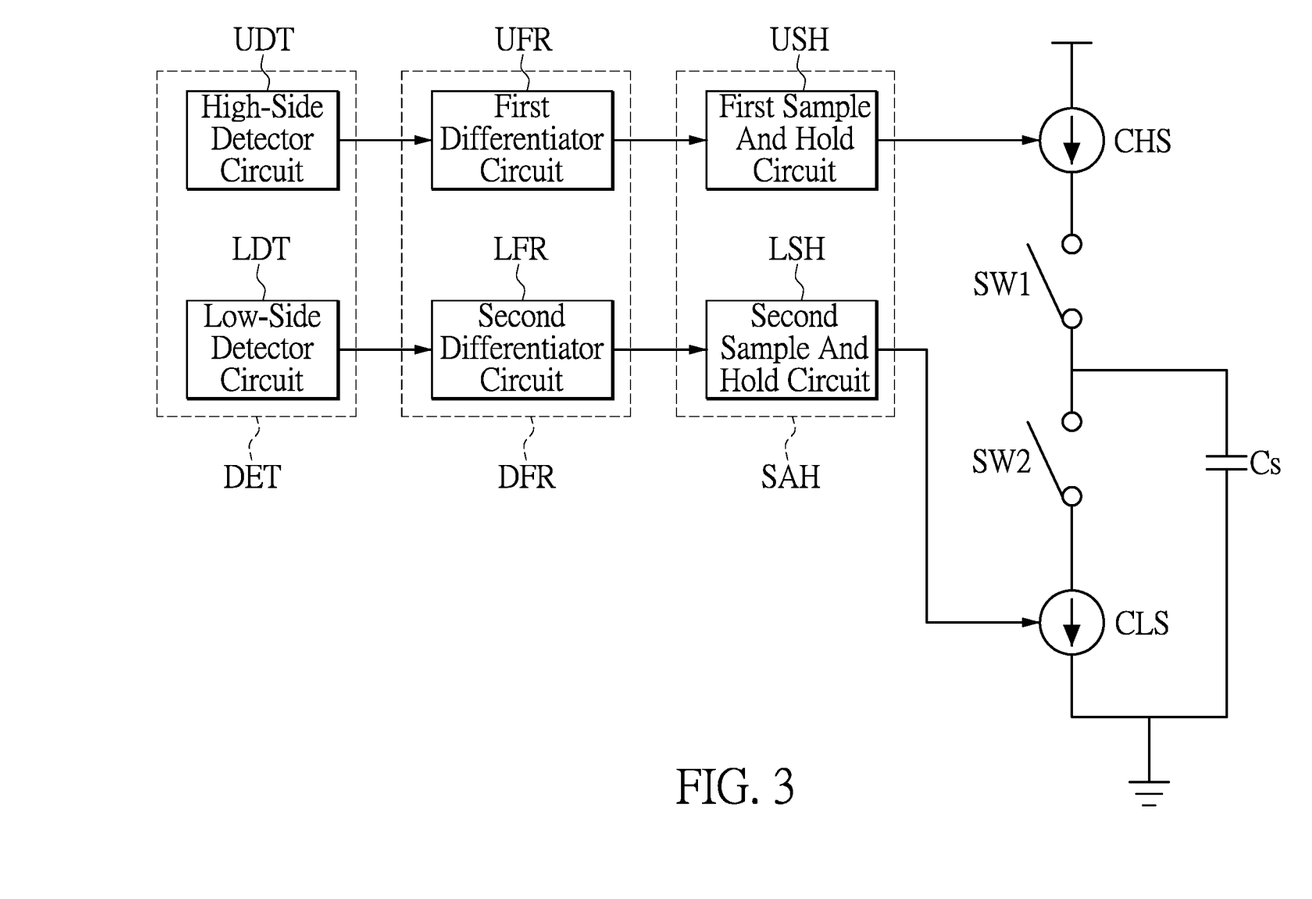
FIG. 3 is a circuit layout diagram of an inductor current detecting circuit according to a second embodiment of the present disclosure.
Figure 5:
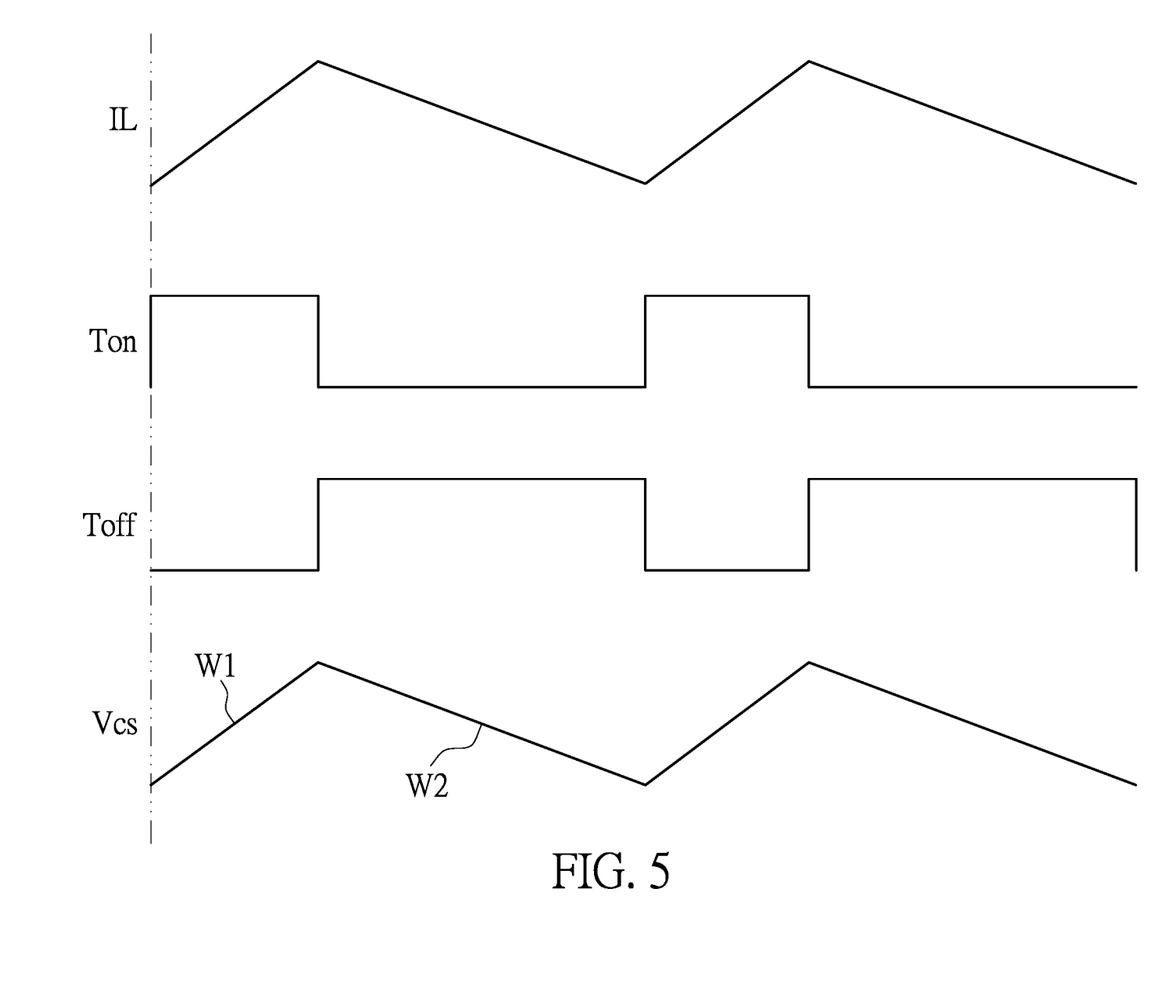
FIG. 5 is a waveform diagram of an inductor current signal, a high-side conduction signal and a low-side conduction signal of the power converter and a voltage signal of a capacitor of the inductor current detecting circuit according to the first embodiment of the present disclosure.

Reference is made to FIGS. 2 and 5, wherein FIG. 2 is a circuit layout diagram of an inductor current detecting circuit according to a first embodiment of the present disclosure, and FIG. 5 is a waveform diagram of an inductor current signal, a high-side conduction signal and a low-side conduction signal of the power converter and a voltage signal of a capacitor of the inductor current detecting circuit according to the first embodiment of the present disclosure.

As shown in FIG. 2, in the embodiment, the inductor current detecting circuit may include a detector circuit DET and a differentiator circuit DFR. The detector circuit DET may be connected to the high-side switch and the low-side switch of the power converter. The detector circuit DET may detect a voltage of the high-side switch to output a high-side voltage signal and detect the low-side switch to output a low-side voltage signal.

It should be understood by those skilled in the art that, an amount of charge of a capacitor Cs is equal to a value generated by integrating a current flowing through the capacitor Cs over time. The current flowing through the capacitor Cs is proportional to a changing rate of a voltage of the capacitor Cs over time, which is represented by the following equation:

$$I = C\frac{dV}{dt},$$

wherein I represents the current flowing through the capacitor Cs, C represents a capacitance of the capacitor Cs, $$\frac{dV}{dt}$$

represents mat a voltage of a voltage signal Vcs of the capacitor Cs is differentiated over time.

Therefore, the detector circuit DET is connected to the differentiator circuit DFR. The detector circuit DET is configured to differentiate a voltage of the high-side voltage signal over time to generate a first differential signal, and differentiates a voltage of the low-side voltage signal over time to generate a second differential signal.

In order to obtain the inductor current signal IL having continuous and complete waveforms, the inductor current detecting circuit of the embodiment may further include the capacitor Cs, a current supplying circuit and a switch circuit. The current supplying circuit may include a first current supplying component CHS and a second current supplying component CLS such as current sources, but the present disclosure is not limited thereto. The switch circuit may include a first switch component SW1 and a second switch component SW2.

In the embodiment, a sample and hold circuit SAH may be optionally disposed in the inductor current detecting circuit. If the sample and hold circuit SAH is not disposed, the first current supplying component CHS and the second current supplying component CLS may be directly connected to the differentiator circuit DFR. The first current supplying component CHS outputs a first charging current according to the first differential signal. The second current supplying component CLS outputs a second charging current according to the second differential signal.

If the sample and hold circuit SAH is disposed in the inductor current detecting circuit, the sample and hold circuit SAH is connected to the differentiator circuit DFR, the first current supplying component CHS and the second current supplying component CLS. The sample and hold circuit SAH samples and holds a parameter such as a voltage of the first differential signal, and outputs the parameter of the first differential signal to the first current supplying component CHS. The sample and hold circuit SAH samples and holds a parameter such as a voltage of the second differential signal, and outputs the parameter of the second differential signal to the second current supplying component CLS.

The first current supplying component CHS may output the first charging current according to the parameter of the first differential signal that is sampled by the sample and hold circuit SAH. The second current supplying component CLS may output the second charging current according to the parameter of the second differential signal that is sampled by the sample and hold circuit SAH.

The first current supplying component CHS is connected to a first terminal of the first switch component SW1. A second terminal of the first switch component SW1 is connected to a first terminal of the second switch component SW2. A second terminal of the second switch component SW2 is connected to the second current supplying component CLS. A first terminal of the capacitor Cs is connected to a node between the first switch component SW1 and the second switch component SW2. A second terminal of the capacitor Cs is connected to the second current supplying component CLS and grounded.

When the first current supplying component CHS supplies the first charging current, the first switch component SW1 is turned on and the second switch component SW2 is turned off Under this condition, the first charging current is allowed to flow to the capacitor Cs through the first switch component SW1 from the first current supplying component CHS. As a result, the capacitor Cs is charged by the first charging current such that a rising waveform segment W1 of the voltage signal Vcs of the capacitor Cs is generated during a high-side conduction time (that is a working period) of a high-side conduction signal Ton as shown in FIG. 5.

Then, when the second current supplying component CLS supplies the second charging current, the first switch component SW1 is turned off and the second switch component SW2 is turned on. Under this condition, the second charging current is allowed to flow to the capacitor Cs through the second switch component SW2 from the second current supplying component CLS. As a result, a falling waveform segment W2 of the voltage signal Vcs of the capacitor Cs is generated during a low-side conduction time (that is a working period) of a low-side conduction signal Toff as shown in FIG. 5. The falling waveform segment W2 is synthesized with the rising waveform segment W1 to form a complete waveform of one cycle.

As described above, the first switch component SW1 and the second switch component SW2 are alternately turned on such that the first charging current and the second charging current are allowed to alternately flow to the capacitor Cs. As a result, the voltage signal Vcs of the capacitor Cs has a complete and continuous waveform and can be converted into the inductor current signal.

Reference is made to FIG. 3, which is a circuit layout diagram of an inductor current detecting circuit according to a second embodiment of the present disclosure.

As shown in FIG. 3, the inductor current detecting circuit of the embodiment may include the detector circuit DET, the differentiator circuit DFR, the sample and hold circuit SAH, the first current supplying component CHS, the second current supplying component CLS, the first switch component SW1, the second switch component SW2, and the capacitor Cs. The same descriptions of the first and second embodiments are not repeated here.

Differences between the first and second embodiments are specifically described in the following. In the second embodiment, the detector circuit DET includes a high-side detector circuit UDT and a low-side detector circuit LDT. The differentiator circuit DFR includes a first differentiator circuit UFR and a second differentiator circuit LFR. The sample and hold circuit SAH includes a first sample and hold circuit USH and a second sample and hold circuit LSH.

The high-side detector circuit UDT is connected to the high-side switch of the power converter and configured to detect the voltage of the high-side switch to output the high-side voltage signal. The first differentiator circuit UFR is connected to the high-side detector circuit UDT and configured to differentiate the high-side voltage signal to generate the first differential signal. The first sample and hold circuit USH is connected to the first differentiator circuit UFR and configured to sample and hold the parameter of the first differential signal.

On the other hand, the low-side detector circuit LDT is connected to the low-side switch of the power converter and configured to detect the voltage of the low-side switch to output the low-side voltage signal. The second differentiator circuit LFR is connected to the low-side detector circuit LDT and configured to differentiate the low-side voltage signal to generate the second differential signal. The second sample and hold circuit LSH is connected to the second differentiator circuit LFR and configured to sample and hold the parameter of the second differential signal.

The first current supplying component CHS is connected to the first sample and hold circuit USH. The second current supplying component CLS is connected to the second sample and hold circuit LSH. When the first switch component SW1 is turned on, the first current supplying component CHS supplies the first charging current to the capacitor Cs according to the parameter of the first differential signal. When the second switch component SW2 is turned on, the second sample and hold circuit LSH supplies the second charging current to the capacitor Cs according to the parameter of the second differential signal.

Figure 4:
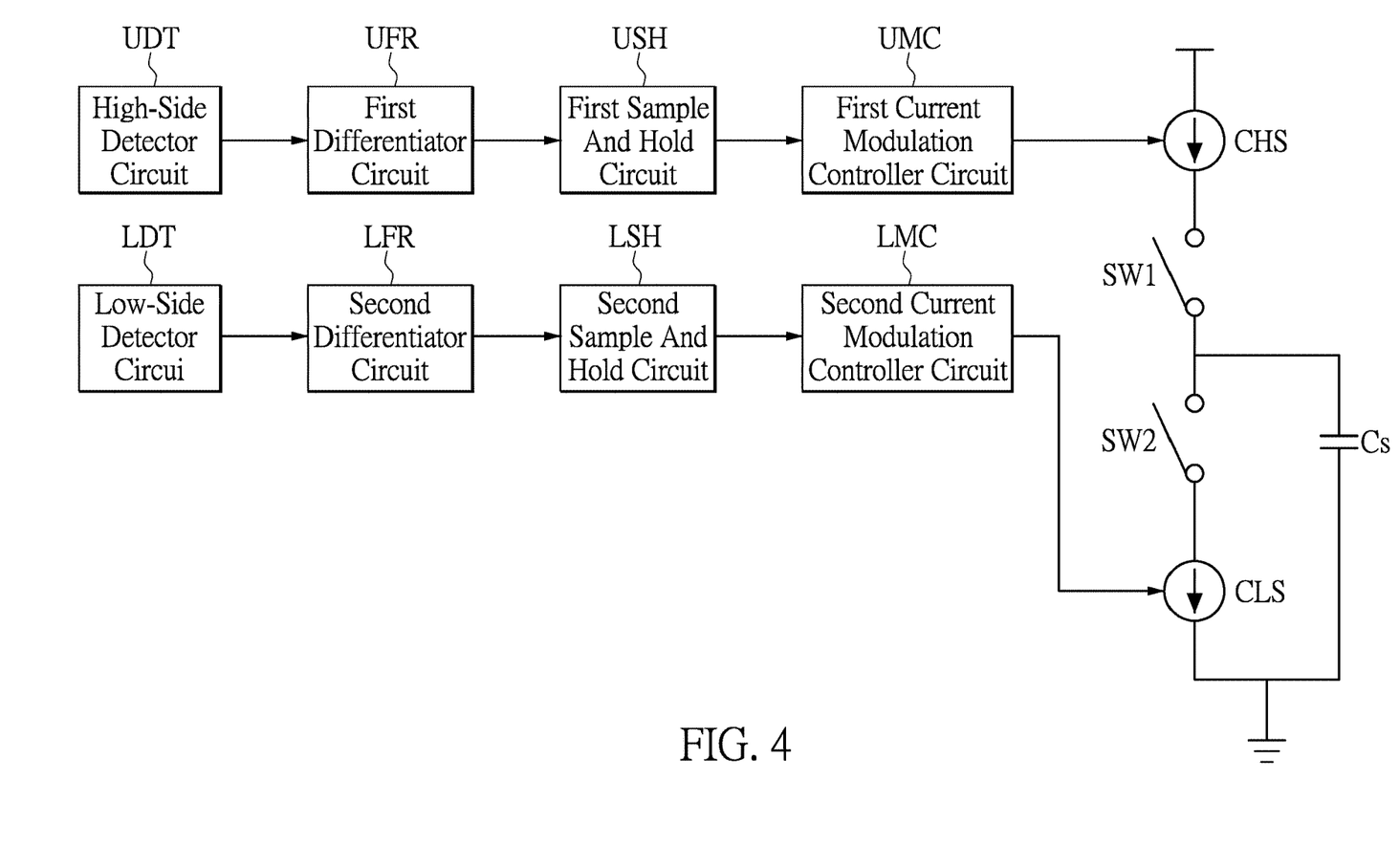
FIG. 4 is a circuit layout diagram of an inductor current detecting circuit according to a third embodiment of the present disclosure.

Reference is made to FIG. 4, which is a circuit layout diagram of an inductor current detecting circuit according to a third embodiment of the present disclosure. Differences between the second embodiment shown in FIG. 3 and the third embodiment shown in FIG. 4 is described in the following, but the same descriptions of them are not repeated here. As shown in FIG. 4, the inductor current detecting circuit of the third embodiment may further include a first current modulation controller circuit UMC and a second current modulation controller circuit LMC.

The first current modulation controller circuit UMC is connected to the first sample and hold circuit USH and the first current supplying component CHS. The first current modulation controller circuit UMC may output a first modulation signal according to the parameter of the first differential signal. For example, the first current modulation controller circuit UMC converts a voltage value of the first differential signal into a current value, and controls the first current supplying component CHS to supply the first charging current to the capacitor Cs according to the current value.

The second current modulation controller circuit LMC is connected to the second sample and hold circuit LSH and the second current supplying component CLS. The second current modulation controller circuit LMC may output a second modulation signal according to the parameter of the second differential signal. For example, the first current modulation controller circuit LMC converts a voltage value of the second differential signal into a current value, and controls the second current supplying component CLS to supply the second charging current to the capacitor Cs according to the current value.

In summary, the present disclosure provides the inductor current detecting circuit for the power converter, in which an additional component such as a resistor that causes unnecessary power consumption is not disposed. The inductor current detecting circuit of the present disclosure can detect the complete waveform of the inductor current signal of the power converter. When the power converter such as a buck converter is operated in a current controlling mode, the high-side switch and the low-side switch are controlled according to the complete waveform of the detected inductor current signal. Therefore, the power converter can achieve the fast response effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An inductor current detecting circuit for a power converter, wherein the power converter includes an output inductor, an output capacitor, a high-side switch, a low-side switch, a comparator, a control circuit and a voltage divider circuit, one terminal of the output inductor is connected to a node between the high-side switch and the low-side switch, another terminal of the output inductor is grounded through the output capacitor, the voltage divider circuit is connected to an output node between the output inductor and the output capacitor and divides an output voltage of the output node to output a feedback voltage, and the comparator compares the feedback voltage with a reference voltage to output a comparison signal, the control circuit turns on or off the high-side switch and the low-side switch according to the comparison signal, the inductor current detecting circuit comprising:

a detector circuit connected to the high-side switch and the low-side switch, and configured to detect the high-side switch to output a high-side voltage signal and detect the low-side switch to output a low-side voltage signal;

a differentiator circuit connected to the detector circuit, and configured to differentiate the high-side voltage signal to generate a first differential signal and differentiate the low-side voltage signal to generate a second differential signal;

a current supplying circuit including a first current supplying component and a second current supplying component, and configured to output a first charging current according to the first differential signal and output a second charging current according to the second differential signal;

a switch circuit including a first switch component and a second switch component, wherein a first terminal of the first switch component is connected to a first terminal of the first current supplying component, a second terminal of the first switch component is connected to a first terminal of the second switch component, and a second terminal of the second switch component is connected to the second current supplying component; and a capacitor, wherein a first terminal of the capacitor is connected to a node between the first switch component and the second switch component, and a second terminal of the capacitor is connected to the second current supplying component and grounded;

wherein the first switch component and the second switch component are alternately turned on, the first charging current and the second charging current alternately flow to the capacitor respectively through the first switch component and the second switch component, such that a voltage signal of the capacitor has a complete and continuous waveform and is able to be converted into an inductor current signal.

2. The inductor current detecting circuit of claim 1, further comprising:

a sample and hold circuit connected to the differentiator circuit and the current supplying circuit, configured to sample and hold parameters of the first differential signal and the second differential signal, and configured to output the parameter of the first differential signal to the first current supplying component and output the parameter of the second differential signal to the second current supplying component.

3. The inductor current detecting circuit of claim 1, wherein the detector circuit includes:

a high-side detector circuit connected to the high-side switch and configured to detect the high-side switch to output the high-side voltage signal; and a low-side detector circuit connected to the low-side switch and configured to detect the low-side switch to output the low-side voltage signal.

4. The inductor current detecting circuit of claim 3, wherein the differentiator circuit includes:

a first differentiator circuit connected to the high-side detector circuit and configured to differentiate the high-side voltage signal to generate the first differential signal; and a second differentiator circuit connected to the low-side detector circuit and configured to differentiate the low-side voltage signal to generate the second differential signal.

5. The inductor current detecting circuit of claim 4, further comprising:

a first sample and hold circuit connected to the first differentiator circuit and the first current supplying component, and configured to sample and hold a parameter of the first differential signal to be outputted to the first current supplying component; and a second sample and hold circuit connected to the second differentiator circuit and the second current supplying component, and configured to sample and hold a parameter of the second differential signal to be outputted to the second current supplying component.

6. The inductor current detecting circuit of claim 5, further comprising:

a first current modulation controller circuit connected to the first sample and hold circuit and the first current supplying component, and configured to output a first modulation signal for controlling the first current supplying component according to the parameter of the first differential signal; and a second current modulation controller circuit connected to the second sample and hold circuit and the second current supplying component, and configured to output a second modulation signal for controlling the second current supplying component according to the parameter of the second differential signal.

7. The inductor current detecting circuit of claim 1, wherein the first current supplying component and the second current supplying component are current sources.

* * * * *